(12) United States Patent
Joei

(10) Patent No.: US 6,777,333 B2
(45) Date of Patent: Aug. 17, 2004

(54) METHOD FOR FABRICATING SEMICONDUCTOR DEVICE

(75) Inventor: Masahiro Joei, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/648,482

(22) Filed: Aug. 27, 2003

(65) Prior Publication Data

US 2004/0048462 A1 Mar. 11, 2004

(30) Foreign Application Priority Data

Sep. 9, 2002 (JP) ........................................ 2002-262429

(51) Int. Cl.[7] .............................................. H01L 21/44
(52) U.S. Cl. ...................... 438/687; 438/635; 438/637; 438/638; 438/639; 438/658; 438/700; 438/707; 438/723; 438/725; 438/743; 438/911; 438/976
(58) Field of Search ......................... 438/635, 637–639, 438/658, 687, 700, 707, 723, 725, 743, 911, 976

(56) References Cited

U.S. PATENT DOCUMENTS

| | | | |
|---|---|---|---|
| 6,632,746 B2 | * | 10/2003 | Kanegae et al. ............ 438/706 |
| 2001/0014529 A1 | * | 8/2001 | Chen et al. ................. 438/637 |
| 2002/0058416 A1 | * | 5/2002 | Kim et al. .................. 438/687 |

FOREIGN PATENT DOCUMENTS

| | | |
|---|---|---|
| JP | P2000-164569 A | 6/2000 |
| JP | P2001-196371 A | 7/2001 |

* cited by examiner

*Primary Examiner*—Lynne A. Gurley
(74) *Attorney, Agent, or Firm*—McDermott Will & Emery LLP

(57) ABSTRACT

A method for fabricating a semiconductor device includes the steps of: forming an insulating film on a conductive pattern formed on a substrate; forming a resist pattern on the insulating film; performing etching to the insulating film using the resist pattern as a mask to form in the insulating film an opening at which part of the surface of the conductive pattern is exposed; forming an antioxidant layer on the part of surface of the conductive pattern exposed while removing the resist pattern; and depositing a conductive film on the conductive pattern from which the antioxidant layer has been removed.

10 Claims, 6 Drawing Sheets

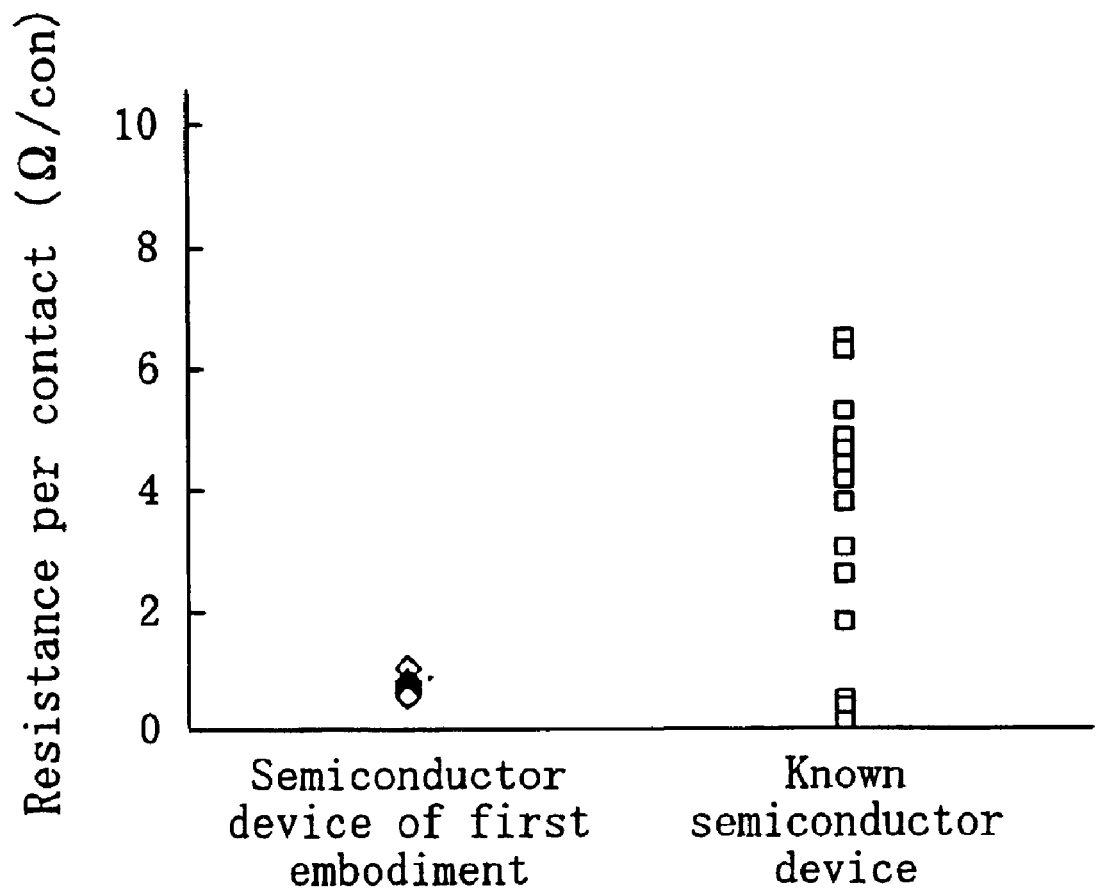

METHOD FOR FABRICATING SEMICONDUCTOR DEVICE

BACKGROUND OF THE INVENTION

The present invention relates to methods for fabricating a semiconductor device, and more particularly relates to a method for forming an interconnect of a semiconductor device.

In recent years, copper has been commonly used as an interconnect material for semiconductor devices. In process steps for processing an interconnect formed by using copper as an interconnect material, used is a damascene process in which an interconnect groove is formed by a dry etching technique and then an interconnect material is filled into the interconnect groove (see, e.g., Japanese Unexamined Patent Publication No. 2001-196371).

Hereinafter, a method for forming an interconnect in a known semiconductor device will be described with reference to the accompanying drawings.

FIGS. 8A through 8D are cross-sectional views illustrating respective process steps for fabricating a known semiconductor device.

First, as shown in FIG. 8A, a silicon oxide film 102 is formed on a semiconductor substrate 101 of silicon and then an interconnect groove is formed in the silicon oxide film 102. Next, a conductive pattern 103 of copper is formed so as to be filled in the interconnect groove formed in the silicon oxide film 102. Subsequently, an insulating film 104 is formed on the silicon oxide film 102 and the conductive pattern 103, and then a resist pattern 105 having an opening 105a is formed on the insulating film 104.

Next, as shown in FIG. 8B, the insulating film 104 is etched by plasma dry etching using the resist pattern 105 as a mask to form an opening 104a in the insulating film 104. In this manner, the surface of the conductive pattern 103 is exposed. The plasma dry etching is performed using a parallel plate RIE system under the conditions where the flow rate of a $CF_4$ gas as an etching gas is 50 mL/min (normal state), the flow rate of an $O_2$ gas as a control gas for a deposit to be etched is 10 mL/min (normal state), the substrate temperature is 25° C., the RF output power is 1000 W, and the inside chamber pressure is 5 Pa.

Next, as shown in FIG. 8C ashing using an oxygen gas is performed to remove the resist pattern 105. The ashing is performed using a microwave plasma ashing system under the conditions where the flow rate of an oxygen gas is 1000 mL/min (normal state), the microwave output power is 2000 W, the discharge time is about 1 minute, the substrate temperature is about 250° C. and the pressure is about 100 Pa. By the ashing, a copper oxide layer 103a having a thickness of about 40 nm is formed on the surface of the conductive film 103.

Next, as shown in FIG. 8D, the copper oxide layer 103a which has been formed during the ashing is removed by cleaning using an organic acid cleaning agent containing aluminum fluoride, and Ar sputtering. Thereafter, a conductive film 106 is formed on part of the conductive pattern 103 from which the copper oxide layer 103a has been removed and the insulating film 104.

In the method for fabricating a known semiconductor device, however, the thickness of the copper oxide layer 103a formed on the surface of the conductive pattern 103 is about 40 nm. That is to say, the copper oxide layer 103a is relatively thick. Accordingly, the copper oxide layer 103a can not be entirely removed by an organic acid cleaning and Ar sputtering, and thus the copper oxide layer 103a is left between the conductive pattern 103 and the conductive film 106, as shown in FIG. 8D. This results in an increase in contact resistance between the conductive pattern 103 and the conductive film 106 or variations in contact resistance therebetween the conductive pattern 103 and the conductive film 106.

SUMMARY OF THE INVENTION

The present invention aims to prevent the progress of oxidation of a conductive pattern in removing a resist pattern and also to prevent the formation of a thick oxide film which is difficult to be removed on the surface of the conductive pattern.

To solve the above-described problems, a first method for fabricating a semiconductor device according to the present invention is characterized by comprising the steps of: forming an insulating film on a conductive pattern formed on a substrate; forming a resist pattern on the insulating film; performing etching to the insulating film using the resist pattern as a mask to form in the insulating film an opening at which part of the surface of the conductive pattern is exposed; forming an antioxidant layer on the part of surface of the conductive pattern exposed while removing the resist pattern; and depositing a conductive film on the conductive pattern from which the antioxidant layer has been removed.

In the first method for fabricating a semiconductor device, an antioxidant layer for preventing oxidation of an conductive pattern is formed on the surface of the conductive pattern while a resist pattern is removed. Thus, it is possible to prevent the progress of oxidation of the conductive pattern in removing the resist pattern and also to prevent the formation of a thick oxide film which is difficult to be removed. Moreover, the antioxidant layer formed on the surface of the conductive pattern can be removed in a simple manner, and thus it is possible to prevent an oxide film from being interposed between the conductive pattern and the conductive film. Therefore, the contact resistance between the conductive pattern and the conductive film can be reduced and variations in the contact resistance therebetween can be suppressed.

In the first method for fabricating a semiconductor device, it is preferable that the conductive pattern contains Cu and the antioxidant layer contains CuO as a main component.

Thus, since an antioxidant layer containing CuO is passive, it prevents oxidation of part of a conductive pattern located under the antioxidant layer. Therefore, it is possible to prevent the formation of a thick oxide film which is difficult to be removed. Accordingly, the antioxidant layer formed on the surface of the conductive layer can be removed in a simple manner.

In the first method for fabricating a semiconductor device, it is preferable that the step of forming an antioxidant layer includes performing oxygen plasma treatment with a substrate temperature of 120° C. or less.

Thus, the proportion of CuO in an antioxidant layer formed on the surface of the conductive pattern is increased while the proportion of $Cu_2O$ therein is reduced. Accordingly, oxidation of the conductive pattern located under the antioxidant layer can be further suppressed and thus the formation of a thick oxide film which is difficult to be removed on the surface of the conductive pattern can be reliably prevented. Therefore, the antioxidant layer formed on the surface of the conductive pattern can be removed in a more simple manner.

In the first method for fabricating a semiconductor device, it is preferable that the step of forming an antioxidant layer includes performing oxygen plasma treatment with a chamber pressure of 40 Pa or less.

Thus, the proportion of CuO in an antioxidant layer formed on the surface of the conductive pattern is increased while the proportion of $Cu_2O$ therein is reduced. Accordingly, oxidation of the conductive pattern located under the antioxidant layer can be further suppressed and thus the formation of a thick oxide film which is difficult to be removed on the surface of the conductive pattern can be reliably prevented. Therefore, the antioxidant layer formed on the surface of the conductive pattern can be removed in a more simple manner.

A second method for fabricating a semiconductor device according to the present invention is characterized by comprising the steps of: forming an insulating film on a conductive pattern formed on a substrate; forming a resist pattern on the insulating film; performing etching to the insulating film using the resist pattern as a mask to form in the insulating film an opening at which part of the surface of the conductive pattern is exposed; forming an antioxidant layer on the part of the surface of the conductive pattern exposed; removing the resist pattern; and depositing a conductive film on the conductive pattern from which the antioxidant layer has been removed.

In the second method for fabricating a semiconductor device, an antioxidant layer is formed on the surface of a conductive pattern and then a resist pattern is removed. Thus, it is possible to prevent the progress of oxidation of the conductive pattern in removing the resist pattern and also to prevent the formation of a thick oxide film which is difficult to be removed. Moreover, the antioxidant layer formed on the surface of the conductive pattern can be removed in a simple manner, and thus it is possible to prevent an oxide film from being interposed between the conductive pattern and the conductive film. Therefore, the contact resistance between the conductive pattern and the conductive film can be reduced and variations in the contact resistance therebetween can be suppressed. Furthermore, the antioxidant layer has been formed on the surface of the conductive pattern before removing the resist pattern. Thus, the resist pattern can be removed in a short time.

In the second method for fabricating a semiconductor device, it is preferable that the conductive pattern contains Cu and the antioxidant layer contains CuO as a main component.

Thus, since an antioxidant layer containing CuO is passive, it prevents oxidation of part of a conductive pattern located under the antioxidant layer. Therefore, it is possible to prevent the formation of a thick oxide film which is difficult to be removed. Accordingly, the antioxidant layer formed on the surface of the conductive layer can be removed in a simple manner.

In the second method for fabricating a semiconductor device, it is preferable that the step of removing the resist pattern includes performing oxygen plasma treatment with a substrate temperature of not less than 200° C. and not more than 250° C.

Thus, a resist pattern can be removed in a short time.

In the second method for fabricating a semiconductor device, it is preferable that the step of forming an antioxidant layer includes performing oxygen plasma treatment with a first substrate temperature, and the step of removing the resist pattern includes performing oxygen plasma treatment with a second substrate temperature which is higher than the first substrate temperature.

Thus, it is possible to prevent the formation of a thick oxide film which is difficult to be removed and also to remove a resist pattern in a short time.

In the second method for fabricating a semiconductor device, it is preferable that the step of forming an antioxidant layer includes performing oxygen plasma treatment at a first pressure, and the step of removing the resist pattern includes performing oxygen plasma treatment at a second pressure which is higher than the first pressure.

Thus, it is possible to prevent the formation of a thick oxide film which is difficult to be removed and also to remove a resist pattern in a short time.

In the second method for fabricating a semiconductor device, the step of forming an antioxidant layer includes performing reactive ion treatment to the conductive pattern, and the step of forming a resist pattern includes performing oxygen plasma treatment.

Thus, it is possible to form an antioxidant layer and remove a resist pattern in a single chamber. Accordingly, an opening at which a conductive pattern is exposed is not exposed to the air, and therefore the progress of oxidation of the surface of the conductive pattern can be prevented.

BRIEF DESCRIPTION OF THE DRAWINGS

FIG. 6 is a graph showing the contact resistance in the semiconductor device of the first embodiment.

DESCRIPTION OF THE PREFERRED EMBODIMENTS

First Embodiment

Hereinafter, a method for fabricating a semiconductor device according to a first embodiment of the present invention will be described with reference to the accompanying drawings.

FIGS. 1A through 1D are cross-sectional views illustrating respective process steps for fabricating a semiconductor device according to the first embodiment of the present invention.

Figure 1A:
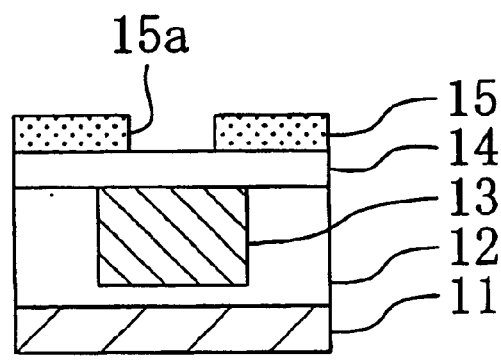
FIGS. 1A through 1D shows cross-sectional views illustrating respective process steps for fabricating a semiconductor device according to the first embodiment of the present invention.

First, as shown in FIG. 1A, a silicon oxide film 12 is formed on a semiconductor substrate 11 of silicon and then an interconnect groove is formed in the silicon oxide film 12. Next, a conductive pattern 13 of copper is formed so as to be filled in the interconnect groove formed in the silicon oxide film 12. Subsequently, an insulating film 14 is formed on the silicon oxide film 12 and the conductive pattern 13, and then a resist pattern 15 having an opening 15a is formed on the insulating film 14. Note that in this case, the conductive pattern 13 may be a lower interconnect or a plug.

Figure 1B:
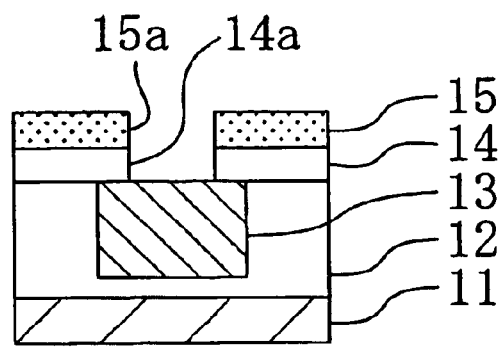

Next, as shown in FIG. 1B, the insulating film 14 is etched by plasma dry etching using the resist pattern 15 as a mask to form an opening 14a in the insulating film 14. In this manner, the surface of the conductive pattern 13 is exposed. The plasma dry etching is performed using a parallel plate RIE system under the conditions where the flow rate of a $CF_4$ gas as an etching gas is 50 mL/min (normal state), the flow rate of an $O_2$ gas as a control gas for a deposit to be etched is 10 mL/min (normal state), the substrate temperature is 25° C. the RE output power is 1000 W, and the inside chamber pressure is 5 Pa.

Figure 1C:
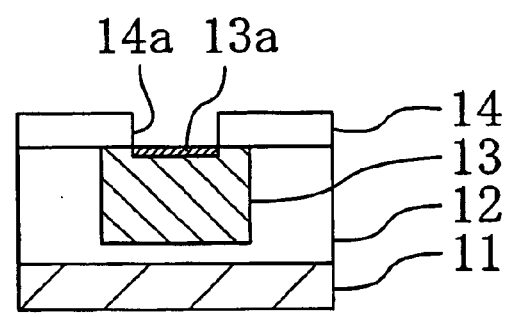

Next, as shown in FIG. 1C, ashing using an oxygen gas is performed to remove the resist pattern 15. The ashing is performed using a microwave plasma ashing system under the conditions where the flow rate of an oxygen gas is 300 mL/min (normal state), the microwave output power is 2000 W, the discharge time is about 3 minutes, the substrate temperature is about 25° C. and the pressure is about 5 Pa. By this ashing, the resist pattern 15 is removed and a copper oxide layer 13a which has a thickness of about 5 nm and serves as an antioxidant layer is formed on part of the surface of the conductive film 13 exposed. Details of the copper oxide layer 13a will be described later.

Figure 1D:
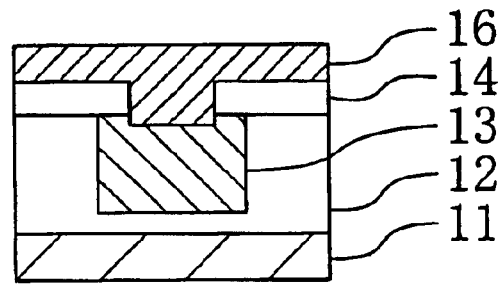

Next, as shown in FIG. 1D, the copper oxide layer 13a which has been formed during the ashing is removed by cleaning using an organic acid cleaning agent containing ammonium fluoride, and Ar sputtering. Thereafter, a conductive film 16 of copper is formed on part of the conductive pattern 13 from which the copper oxide layer 13a has been removed and the insulating film 14. Then, although not shown in FIG. 1D, as many conductive films as necessary are formed one by one, and furthermore a passivation film and the like are formed. Thus, a semiconductor device is completed.

Now, the copper oxide layer 13a formed during the ashing as shown in FIG. 1C will be specifically described.

First, differences in composition between the copper oxide layer 13a formed in the first embodiment of the present invention and the copper oxide layer 103a formed in the method for fabricating the known semiconductor device will be described.

Figure 2:
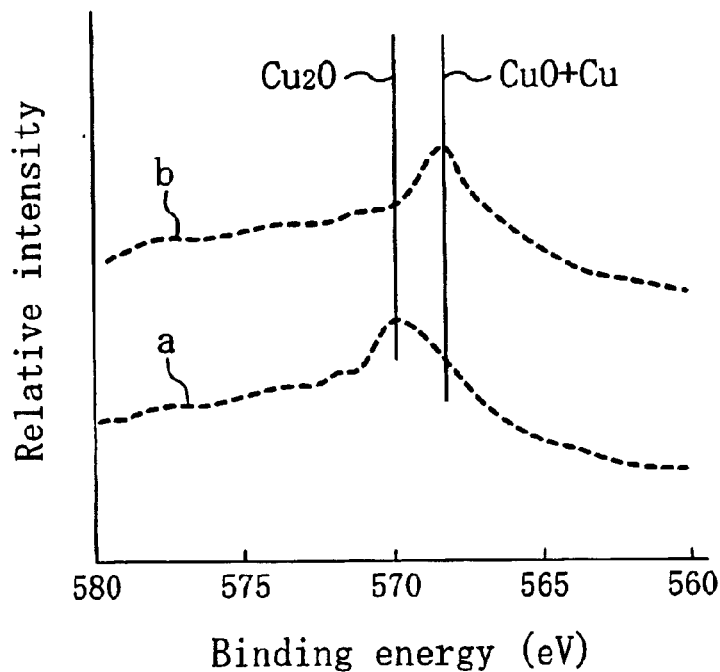
FIG. 2 a graph showing the XPS spectrum of the surface of a copper oxide layer according to the first embodiment.

FIG. 2 is a graph showing the XPS spectrum of surface of the copper oxide layer 13a from which the resist pattern 15 has been removed by ashing. Note that in FIG. 2, the abscissa indicates binding energy and the ordinate indicates relative intensity.

In general, oxidized forms of Cu include a form represented by $Cu_2O$ where the copper and oxygen ratio is 1:2 and a form represented by CuO where the copper and oxygen ratio is 1:1.

As in the known example, when ashing is performed at high temperature and high pressure to remove the resist pattern 105, the known copper oxide layer 103a containing $Cu_2O$ as a main component is formed as indicated by the bottom line (a) of FIG. 2. On the other hand, as in the first embodiment of the present invention, when ashing is performed at a low temperature or a low pressure to remove the resist pattern 15, the copper oxide layer 13a containing CuO as a main component is formed as indicated by the upper line (b) of FIG. 2.

The reason why the compositions of the copper oxide layer 13a of this embodiment and the copper oxide layer 103a of the known example are different is as follows. At high temperature and high pressure, Cu undergoes a thermal reaction to be oxidized and thus $Cu_2O$, which lacks oxygen, is mainly generated. At a low temperature or a low pressure, in contrast, the semiconductor substrate 11 and a ground are coupled and thereby oxygen ions are forcibly implanted into the surface of the conductive pattern 13. Thus, oxygen rich CuO is mainly generated on the surface of the conductive pattern 13.

Next, differences in thickness between the copper oxide layer 13a formed in the first embodiment of the present invention and the copper oxide layer 103a formed in the method for fabricating a known semiconductor device due to differences between their components will be described.

Figure 3:
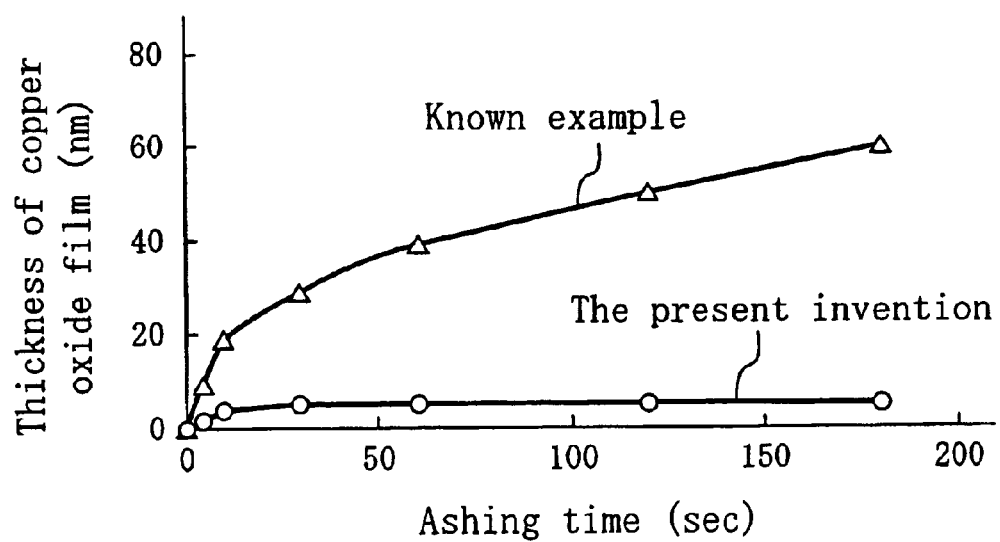
FIG. 3 is a graph showing the relation between the ashing time and the thickness of a copper oxide layer in the first embodiment.

FIG. 3 is a graph showing the relation between the ashing time and the thickness of a copper oxide layer in this embodiment.

As shown in FIG. 3, as for the copper oxide layer 103a containing as a main component $Cu_2O$ formed in the method for fabricating the known semiconductor device, the film thickness increases as the ashing time increases.

In contrast, as for the copper oxide layer 13a containing CuO as a main component and formed in the present invention, the following fact has been confirmed. As shown in FIG. 3, immediately after the start of the ashing, Cu contained in the conductive pattern 13 is oxidized and then CuO with a thickness of about 5 nm is generated, so that the copper oxide layer 13a containing CuO is formed. Thereafter, even though the ashing is continuously performed, oxidation does not further proceed. This is because the copper oxide layer 13a containing CuO as a main component is passive and functions as an antioxidant layer for preventing the progress of oxidation of the conductive pattern 13 under the copper oxide layer 13a. As has been described, the progress of the oxidation is prevented and thus the copper oxide layer 13a is kept thin. Therefore, the copper oxide layer 13a can be removed in a simple manner by cleaning using an organic acid agent containing ammonium fluoride, and Ar sputtering.

Figure 4:
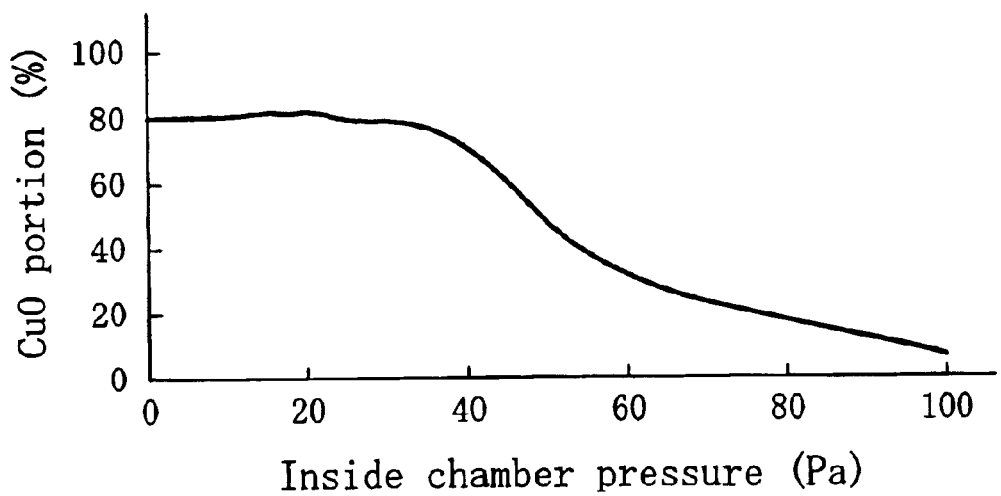
FIG. 4 is a graph showing the relation between the inside chamber pressure and the CuO generation ratio in the first embodiment.

FIG. 4 is a graph showing the relation between the pressure of inside of a chamber during ashing and the generation ratio of CuO to the entire copper oxide formed by the ashing.

As shown in FIG. 4, when the inside chamber pressure is over 40 Pa, oxygen ions are scattered and thus the kinetic energy of oxygen ions is reduced. Accordingly, the amount of implanted oxygen ions into the surface of the conductive pattern 13 is reduced. Thus, the generation ratio of CuO to the entire copper oxide is low. On the other hand, when the inside chamber pressure is 40 Pa or less, the generation ratio of CuO to the entire copper oxide is high. Note that the preferable lower limit of the inside chamber pressure is not particularly limited. However, with the inside chamber pressure of 1 Pa or more, the resist pattern 15 can be sufficiently removed by ashing. Therefore, it is more preferable that the inside chamber pressure is 1 Pa or more.

Figure 5:
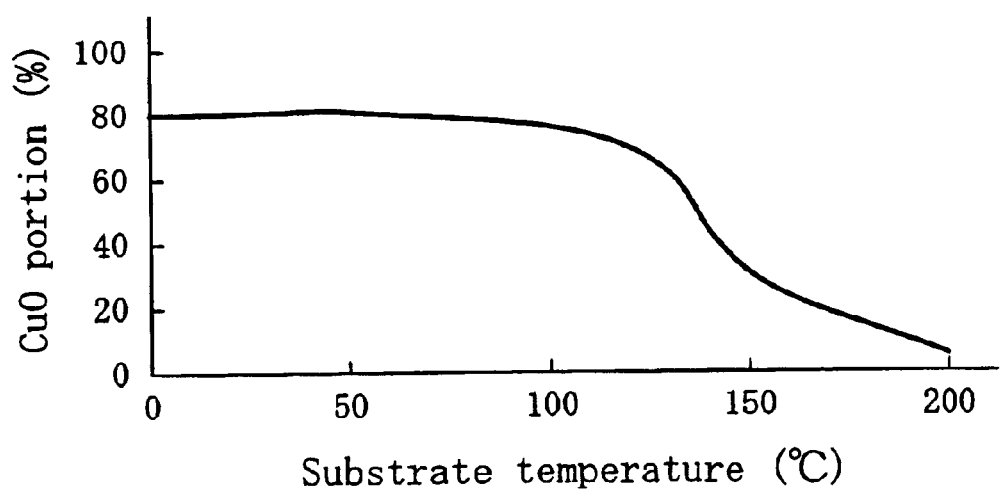
FIG. 5 is a graph showing the relation between the substrate temperature and the CuO generation ratio in the first embodiment.

FIG. 5 is a graph showing the relation between the substrate temperature and the generation ratio of CuO to the entire copper oxide formed by ashing.

As shown in FIG. 5, the substrate temperature is over 120° C. a thermal reaction is accelerated. Accordingly, $Cu_2O$ is rapidly generated and therefore the generation ratio of CuO to the entire copper oxide becomes low. On the other hand, when the substrate temperature is 120° C. or less, the generation ratio of Cu to the entire copper oxide is high. Note that the preferable lower limit of the substrate temperature is not particularly limited. However, it is more preferable that the substrate temperature is 0° C. or more in order to avoid making a semiconductor device complicated.

As has been described, it has been clearly shown by FIGS. 4 and 5 that if ashing is performed with a substrate temperature of 120° C. or less or with an inside chamber pressure of 40 Pa or less, the proportion of CuO in the copper oxide layer 13a as an antioxidant layer formed on the conductive pattern 13 is increased while the proportion of $Cu_2O$ generated on the surface of the conductive pattern 13 is reduced. Accordingly, the oxidation of the conductive pattern 13 can be further suppressed and thus the formation of a thick oxide film which is difficult to be removed on the surface of the conductive pattern 13 can be reliably prevented. Therefore, the antioxidant layer formed on the surface of the conductive pattern 13 can be removed in a more simple manner.

FIG. 6 is a graph showing the contact resistances in the semiconductor device of this embodiment and the semiconductor device of the known example. More specifically, FIG. 6 shows measured values of contact resistance for fifteen contacts between the conductive pattern 13 and the conductive layer 16 of this embodiment and for fifteen contacts between the conductive pattern 103 and the conductive layer 106 of the known example.

As is evident from FIG. 6, compared to the measured values of contact resistance for fifteen contacts between the conductive pattern 103 and the conductive layer 106 of the known example, the measured values of contact resistance for fifteen contacts between the conductive pattern 13 and the conductive layer 16 of this embodiment are largely reduced and variations among the values are also reduced.

Note that in the known example, ashing is performed to the resist pattern 105 at high temperature and high pressure because a time required for removal of the resist pattern 105 by the ashing is intended to be reduced. These temperature and pressure conditions are considered to be proper to be adopted in order to achieve original purpose of ashing.

On the other hand, in the first embodiment of the present invention, ashing is performed to the resist pattern 15 at a low temperature or a low pressure. Only in view of the purpose of removing the resist pattern 15, these temperature and pressure conditions are not usually adopted because such conditions will cause a reduction in throughput. However, if ashing is performed to the resist pattern 15 at a low temperature or a low pressure, the copper oxide layer 13a which contains CuO as a main component and functions as an antioxidant layer can be formed on the surface of the conductive pattern 13. The copper oxide layer 13a containing CuO as a main component can be removed in a simple manner. Thus, by forming the conductor film 16 after the copper oxide layer 13a has been removed, the noticeable effect of largely reducing the contact resistance between the conductive pattern 16 and the conductive film 16 can be achieved.

Note that by using a microwave plasma ashing system in performing ashing to the resist pattern 15, the ion bombardment effect due to coupling between the semiconductor substrate 11 and the ground is utilized as has been described using FIG. 1C. However, even when some other ashing apparatus is used, the same effects can be attained. It is supposed that if a bias-power applying type system in which ion energy can be controlled is used, the contact resistance between the conductive pattern 13 and the conductive film 16 can be further reduced and variations in the contact resistance therebetween can be further reduced.

As has been described, in the first embodiment, the copper oxide layer 13a as an antioxidant layer for preventing the conductive pattern 13 from being oxidized is formed on the surface of the conductive pattern 13 while the resist pattern 15 is removed by ashing. Thus, it is possible to prevent the progress of oxidation of the conductive pattern 13 in removing the resist pattern 15 and also to prevent the formation of a thick oxide film which is difficult to be removed on the surface of the conductive pattern 13. Moreover, the copper oxide layer 13a formed on the surface of the conductive pattern 13 can be removed in a simple manner, and thus it is possible to prevent an oxide film from being interposed between the conductive pattern 13 and the conductive film 16. Therefore, the contact resistance between the conductive pattern 13 and the conductive film 16 can be reduced and variations in the contact resistance therebetween can be suppressed.

Second Embodiment

Hereinafter, a method for fabricating a semiconductor device according to a second embodiment of the present invention will be described with reference to the accompanying drawings.

FIGS. 7A through 7E are cross-sectional views illustrating respective process steps for fabricating a semiconductor device of the second embodiment of the present invention.

Differences between the methods for fabricating a semiconductor device according to the second embodiment and the above-described first embodiment will be described. In the fabrication method of the first embodiment, as has been described, the copper oxide layer 13a is formed and the resist pattern 15 is removed in the same process step. However, in the fabrication method of the second embodiment, as will be described later, a copper oxide layer 23a (which will be described later) is formed and a resist pattern 25 (which will be described later) is removed separately in different process steps. A specific description is as follows.

Figure 7A:
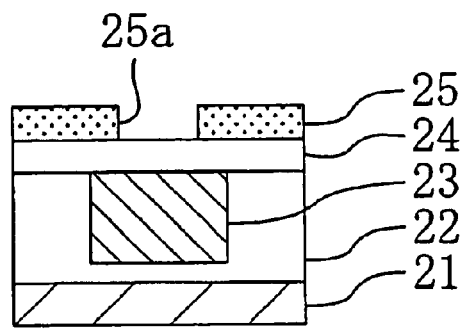
FIGS. 7A through 7E cross-sectional views illustrating respective process steps for fabricating a semiconductor device of the second embodiment of the present invention.

First, as shown in FIG. 7A, a silicon oxide film 22 is formed on a semiconductor substrate 21 of silicon and then an interconnect groove is formed in the silicon oxide film 22. Next, a conductive pattern 23 of copper is formed so as to be filled in the interconnect groove formed in the silicon oxide film 22. Subsequently, an insulating film 24 is formed on the silicon oxide film 22 and the conductive pattern 23, and then a resist pattern 25 having an opening 25a is formed on the insulating film 24. Note that in this case, the conductive pattern 23 may be a lower interconnect or a plug.

Figure 7B:
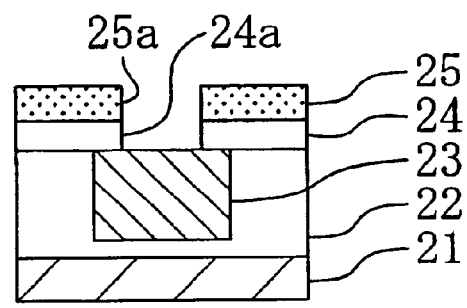

Next, as shown in FIG. 7B, the insulating film 24 is etched by plasma dry etching using the resist pattern 25 as a mask to form an opening 24a in the insulating film 24. In this manner, the surface of the conductive pattern 23 is exposed. The plasma dry etching is performed using a parallel plate RIE system under the conditions where the flow rate of a $CF_4$ gas as an etching gas is 50 mL/min (normal state), the flow rate of an $O_2$ gas as a control gas for a deposit to be etched is 10 mL/min (normal state), the substrate temperature is 25° C. the RF output power is 1000 W, and the inside chamber pressure is 5 Pa.

Figure 7C:
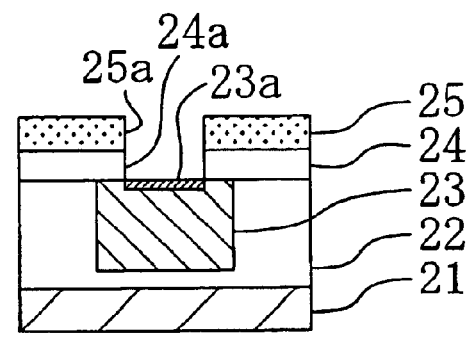

Next, as shown in FIG. 7C, continuously using the parallel plate RIE system which has been used in the plasma dry etching, oxygen plasma treatment is performed in the same chamber under the conditions where the flow rate of an oxygen gas is about 300 mL/min (normal state), the RF output power is 200 W, the discharge time is about 10 seconds, the substrate temperature is 25° C. and the pressure is about 5 Pa. Thus, a copper oxide layer 23a which contains CuO as a main component, has a thickness of about 5 nm, and serves as an antioxidant layer is formed on the surface of the conductive film 23. As has been described, the oxygen plasma treatment is performed in the same chamber, and thus the opening 24a at which the conductive pattern 23 is exposed is not exposed to the air. Accordingly, oxidation of the surface of the conductive pattern 23 can be prevented. Moreover, since the copper oxide layer 23a is passive, the thickness of the copper oxide layer 23a is not increased any more like the copper oxide layer 13a in the first embodiment.

Figure 7D:
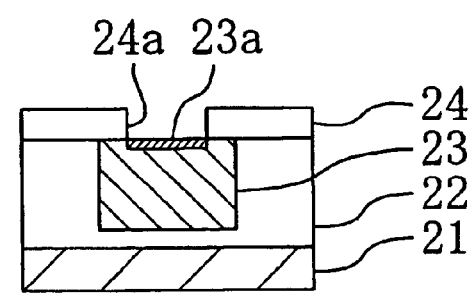

Next, as shown in FIG. 7D, ashing using an oxygen gas is performed to remove the resist pattern 25. The ashing is performed using a microwave plasma ashing system under the conditions where the flow rate of an oxygen gas is 1000 mL/min (normal state), the microwave output power is 2000 W, the substrate temperature is about 250° C. and the pressure is about 100 Pa. As has been described, unlike the first embodiment, since the copper oxide layer 23a as an antioxidant layer has been formed before the resist pattern is removed by ashing, the resist pattern 25 is removed by performing ashing at high temperature and high pressure. Thus, the discharge time can be reduced to about 1 minute. Note that the plasma treatment is preferably performed with the substrate temperature of not less than 200° C. and not more than 250° C.

Figure 7E:
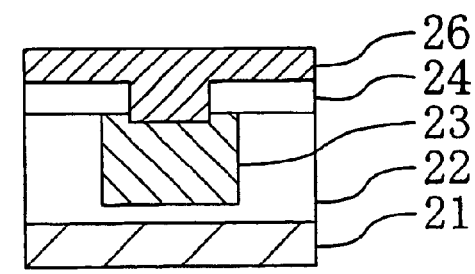
Figure 8A:
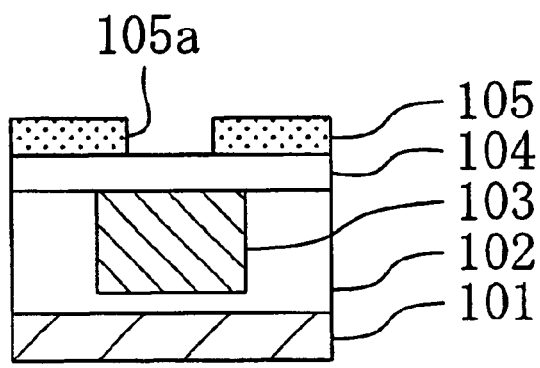
FIGS. 8A through 8D are cross-sectional views illustrating respective process steps for fabricating a known semiconductor device.
Figure 8B:
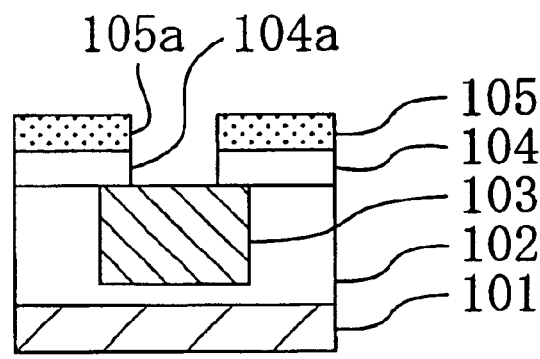
Figure 8C:
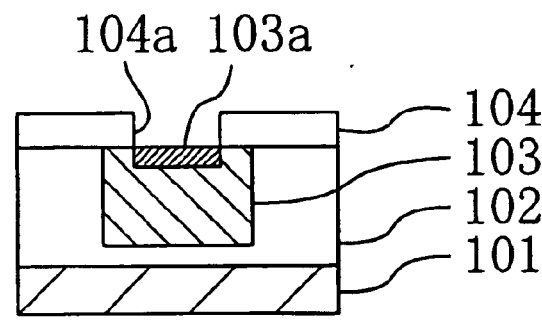
Figure 8D:
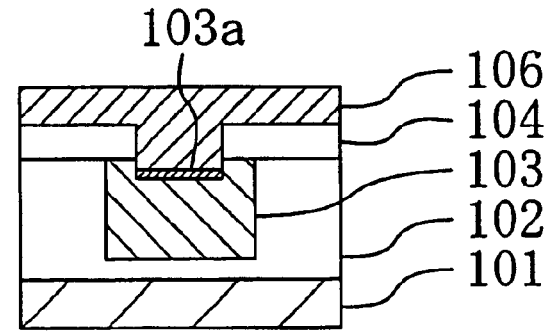

Next, as shown in FIG. 7E, the copper oxide layer 23a is removed by cleaning using an organic acid cleaning agent containing ammonium fluoride, and Ar sputtering. Thereafter, a conductive film 26 of copper is formed on part of the conductive pattern 23 from which the copper oxide layer 23a has been removed and the insulating film 24. Then, although not shown in FIG. 7E, as many conductive films as necessary are formed one by one, and furthermore a passivation film and the like are formed. Thus, a semiconductor device is completed.

As has been described, in the second embodiment, the copper oxide layer 23a as an antioxidant layer for preventing oxidation of the conductive pattern 23 is formed on the surface of the conductive pattern 23. Thus, it is possible to prevent the progress of oxidation of the conductive pattern 23 in removing the resist pattern 25 and also to prevent the formation of a thick oxide film which is difficult to be removed on the surface of the conductive pattern 23. Moreover, the copper oxide layer 23a formed on the surface of the conductive pattern 23 can be removed in a simple manner, and thus it is possible to prevent an oxide film from being interposed between the conductive pattern 23 and the conductive film 26. Therefore, the contact resistance between the conductive pattern 23 and the conductive film 26 can be reduced and variations in the contact resistance therebetween can be suppressed. Furthermore, the copper oxide layer 23a has been formed on the surface of the conductive pattern 23 before removing the resist pattern 25. Thus, the resist pattern 25 can be removed at high throughput by ashing at high temperature and high pressure.

Note that in the second embodiment, the case where a parallel plate RIE system is used as a means for forming on the surface of the conductive pattern 23 the copper oxide layer 23a containing CuO as a main component and serving as an antioxidant layer has been described. However, as in the first embodiment, an ashing system may be used to form the copper oxide layer 23a at a low temperature or a high pressure. In such a case, by operating an ashing system at high temperature and high pressure after an antioxidant layer has been formed on the surface of the conductive pattern 23, ashing to the resist pattern 25 can be finished in a short time.

What is claimed is:
1. A method for fabricating a semiconductor device comprising the steps of:
   forming an insulating film on a conductive pattern formed on a substrate;
   forming a resist pattern on the insulating film;
   performing etching to the insulating film using the resist pattern as a mask to form in the insulating film an opening at which part of a surface of the conductive pattern is exposed;
   forming, by performing oxygen plasma treatment, a passive antioxidant layer on the part of the surface of the conductive pattern exposed while removing the resist pattern; and
   depositing a conductive film on the conductive pattern from which the antioxidant layer has been removed,
   wherein the antioxidant layer contains CuO as a main component.

2. The method of claim 1, wherein the conductive pattern contains Cu.

3. The method of claim 2, wherein the step of forming an antioxidant layer includes performing oxygen plasma treatment with a substrate temperature of 120° C. or less.

4. The method of claim 2, wherein the step of forming an antioxidant layer includes performing oxygen plasma treatment with a chamber pressure of 40 Pa or less.

5. A method for fabricating a semiconductor device comprising the steps of:
   forming an insulating film on a conductive pattern formed on a substrate;
   forming a resist pattern on the insulating film;
   performing etching to the insulating film using the resist pattern as a mask to form in the insulating film an opening at which part of the surface of the conductive pattern is exposed;
   forming, by performing oxygen plasma treatment, a passive antioxidant layer on the part of the surface of the conductive pattern exposed;
   after forming the antioxidant layer, removing the resist pattern by performing oxygen plasma treatment; and
   depositing a conductive film on the conductive pattern from which the antioxidant layer has been removed,
   wherein the antioxidant layer contains CuO as a main component.

6. The method of claim 5, wherein the conductive pattern contains Cu.

7. The method of claim 6, wherein the step of removing the resist pattern includes performing oxygen plasma treatment with a substrate temperature of not less than 200° C. and not more than 250° C.

8. The method of claim 5, wherein the step of forming an antioxidant layer includes performing oxygen plasma treatment with a first substrate temperature, and
   the step of removing the resist pattern includes performing oxygen plasma treatment with a second substrate temperature which is higher than the first substrate temperature.

9. The method of claim 5, wherein the step of forming an antioxidant layer includes performing oxygen plasma treatment at a first pressure, and
   the step of removing the resist pattern includes performing oxygen plasma treatment at a second pressure which is higher than the first pressure.

10. The method of claim 5, wherein the step of forming the antioxidant layer includes preforming reactive ion treatment to the conductive pattern.

* * * * *